United States Patent
Hodes et al.

(10) Patent No.: US 7,825,324 B2
(45) Date of Patent: Nov. 2, 2010

(54) SPREADING THERMOELECTRIC COOLERS

(75) Inventors: Marc Scott Hodes, Dublin (IE); Christopher D. W. Jones, Millington (IE); Shankar Krishnan, Dublin (IE); Oana Malis, New Providence, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 303 days.

(21) Appl. No.: 11/618,056

(22) Filed: Dec. 29, 2006

(65) Prior Publication Data
US 2008/0155992 A1    Jul. 3, 2008

(51) Int. Cl.
*H01L 35/28* (2006.01)
*F25B 21/02* (2006.01)

(52) U.S. Cl. .................. 136/208; 136/210; 136/212; 62/3.3

(58) Field of Classification Search ............. 62/3.2, 62/307, 3.3, 3.7; 136/206, 208–212
See application file for complete search history.

(56) References Cited

U.S. PATENT DOCUMENTS

| | | | |
|---|---|---|---|
| 3,794,527 A * | 2/1974 | Kim | 136/208 |
| 4,204,882 A * | 5/1980 | Howell | 136/202 |
| 5,022,928 A * | 6/1991 | Buist | 136/212 |
| 6,164,076 A * | 12/2000 | Chu et al. | 62/3.7 |
| 6,226,994 B1 * | 5/2001 | Yamada et al. | 62/3.7 |
| 6,563,227 B1 | 5/2003 | Strnad | |
| 6,686,532 B1 * | 2/2004 | Macris | 136/204 |
| 6,818,817 B2 | 11/2004 | Macris | |
| 2002/0033189 A1 | 3/2002 | Macris | |
| 2003/0102118 A1 * | 6/2003 | Sagal et al. | 165/185 |
| 2004/0165355 A1 | 8/2004 | Chen | |
| 2005/0077619 A1 | 4/2005 | Ramanathan et al. | |
| 2006/0001153 A1 | 1/2006 | Sakamoto | |
| 2006/0107986 A1 | 5/2006 | Abramov et al. | |
| 2006/0179849 A1 * | 8/2006 | Abramov et al. | 62/3.3 |
| 2006/0180192 A1 | 8/2006 | Sharp et al. | |
| 2006/0237730 A1 | 10/2006 | Abramov | |

FOREIGN PATENT DOCUMENTS

DE    3935610 A1    5/1991

\* cited by examiner

*Primary Examiner*—Frantz F. Jules
*Assistant Examiner*—Emmanuel Duke
(74) *Attorney, Agent, or Firm*—Hitt Gaines, PC (57) ABSTRACT

An apparatus includes a thermoelectric cooler having a first set of one or more metal electrodes, a second set of one or more metal electrodes, and one or more doped semiconductor members. Each member physically joins a corresponding one electrode of the first set to a corresponding one electrode of the second set. Each member has a cross-sectional area that increases along a path from the one metal electrode of the first set to the one metal electrode of the second set.

21 Claims, 5 Drawing Sheets

SPREADING THERMOELECTRIC COOLERS

TECHNICAL FIELD OF THE INVENTION

The present invention is directed, in general, to thermoelectric coolers.

BACKGROUND OF THE INVENTION

A thermoelectric cooler (TEC), also known as a Peltier cooler, is a solid-state electrical device that may be configured to transport heat when current is passed through a number of semiconducting "pellets." The pellets are typically configured in a series circuit arranged to produce a desired degree of cooling and device resistance. The direction of heat transport in a TEC may be determined by the direction of current flow through the pellets.

TECs provide a convenient and effective means of temperature control in many applications. In one such application, these devices have been used in electronics systems to reduce the operating temperature of electronic components. Such cooling is especially appropriate where system design constraints preclude the use of cooling fins or forced air flow. TECs may also be used to refrigerate a component by cooling the component below the ambient temperature. Also, by coupling the TEC to a feedback system, a TEC may be used to regulate the temperature of a device by operating in both a heating and a cooling mode.

SUMMARY OF THE INVENTION

In one embodiment, the apparatus includes a thermoelectric cooler including a first set of one or more metal electrodes, a second set of one or more metal electrodes, and one or more doped semiconductor members. Each member physically joins a corresponding one electrode of the first set to a corresponding one electrode of the second set. Each member has a cross-sectional area that increases along a path from the one metal electrode of the first set to the one metal electrode of the second set.

Another embodiment is a method of cooling a heat generating device. The method includes driving a current through a thermoelectric cooler whose electrical conduction path has metal electrodes and one or more doped semiconductor members. Neighboring electrodes on the path are connected by one of the one or more doped semiconductor members. The current causes heat to be absorbed from the device at a first non-null subset of the electrodes and to be dissipated at a second non-null subset of the electrodes. Each electrode is in the first or second subset, and the first and second subsets are disjoint. The current flows over a cross-sectional area of semiconductor that varies monotonically in one or more of the members.

Another embodiment is a system. The system includes an electronic device configured to dissipate power. A thermoelectric cooler with a central region is in thermal contact with the electronic device. The cooler includes a first set of one or more metal electrodes, a second set of one or more metal electrodes, and one or more doped semiconductor members. Each member physically joins a corresponding one electrode of the first set to a corresponding one electrode of the second set. Each member has a cross-sectional area that increases along a path from the one metal electrode of the first set to the one metal electrode of the second set.

BRIEF DESCRIPTION OF THE DRAWINGS

Various embodiments are understood from the following detailed description, when read with the accompanying figures. Various features may not be drawn to scale and may be arbitrarily increased or reduced in size for clarity of discussion. Reference is now made to the following descriptions taken in conjunction with the accompanying drawings, in which.

DETAILED DESCRIPTION

In a conventional thermoelectric cooler (TEC) pellets are typically arranged in a Cartesian geometry. While such a design provides relatively uniform cooling over the surface of the TEC, it may not effectively accommodate an electronic device or a portion of a device that has a power dissipation concentrated in an area significantly less than the effective cooling area of the TEC. Such a device may develop a "hot spot," resulting in reduced efficiency and lifetime of the device.

The embodiments described herein recognize that a thermoelectric cooler (TEC) may be used to effectively transport heat from a power-dissipating source by employing pellets having a cross-sectional area that increases in the direction of heat flow in the pellets. In this manner the heat is "spread" over an increased surface area. This spreading provides for increased efficiency of removal of the heat from the TEC.

Figure 1A:
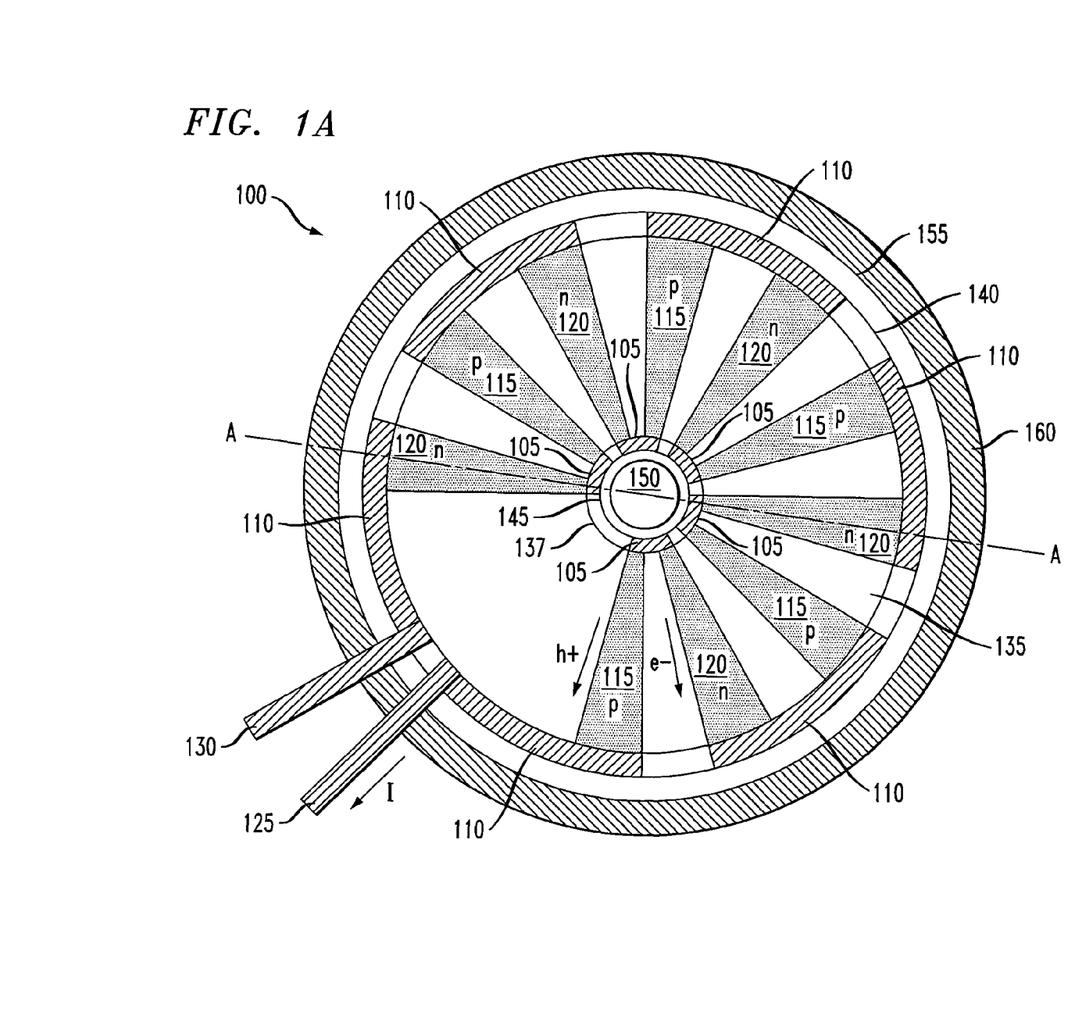
FIGS. 1A and 1B illustrate an embodiment of a spreading thermoelectric cooler (TEC)

FIG. 1A illustrates a spreading TEC 100. The TEC 100 includes a first set 105 of metal electrodes, and a second set 110 of metal electrodes. Semiconductor members 115, 120 physically join a corresponding one electrode from the first set 105 to a corresponding one electrode from the second set 110. In this manner, a serial current path is formed from a terminal 125 to a terminal 130 via the metal electrodes 105, 110 and the semiconductor members 115, 120.

The electrodes 105 and the electrodes 110 together form a set of electrodes. The electrodes 105 form a first non-null subset of this set of electrodes. Similarly, the electrodes 110 form a second non-null subset of this set of electrodes. The first non-null subset and the second non-null subset are disjoint, meaning no electrode belongs to both sets.

The doped semiconductor members 115, 120 are commonly referred to in the art as pellets, and are referred to as such hereinafter. The pellets 115, 120 include p-type pellets 115 and n-type pellets 120. The pellets 115, 120 may be a semiconducting material chosen for efficient operation of the TEC 100 at an anticipated operating temperature. Those skilled in the art of TEC design are familiar with figures of merit that characterize suitable semiconducting materials.

Numerous such materials are known, and research on improved materials is ongoing. Examples include, e.g., $Bi_2Te_3$, $Zn_4Sb_3$, PbTe, and $CeFe_4Sb_{12}$, and superlattices of $Bi_2Te_3/Sb_2Te_3$.

The choice of material for the pellets 115, 120 is guided in part by the intended operating temperature of the TEC 100. $Bi_2Te_3$ is widely used, and is well suited for use at an operating temperature ranging from about 0° C. to about 200° C. It is therefore assumed for the present discussion that $Bi_2Te_3$ is used for the pellets 115, 120, while recognizing that other doped semiconducting materials may be used.

The n-type pellets 120 are typically provided with n-type semiconducting properties by either doping with impurity atoms or varying the stoichiometry of the pellet material from ideal ratios of constituent elements. For example, a fraction of tellurium atoms may be substituted with selenium to produce n-type $Bi_2Te_3$. In a similar manner, p-type characteristics are conventionally imparted to the p-type pellets 115.

The electrodes 105, 110 may be formed of a metal with sufficient conductivity so that insignificant ohmic heating is produced in the electrodes 105, 110 by a current I used to operate the TEC 100. In addition, a conductive diffusion barrier (not shown) may be formed over the electrodes 105, 110 to reduce diffusion of the electrode material into the pellets 115, 120, and to promote a low-resistance interface with the pellets 115, 120. If the resistance of the interface is sufficiently high, power dissipated at the interface may reduce the efficiency of the TEC 100. High resistance may occur, e.g., from imperfections at the interface when the electrodes 105, 110 are soldered to the pellets 115, 120. The diffusion barrier may also be chosen to be metallurgically compatible with the electrode material. As a non-limiting example, when the electrode material is copper, nickel may be used as a diffusion barrier having the desired characteristics.

The pellets 115, 120 are laterally separated from each other by insulators 135. The insulators 135 isolate the pellets 115, 120 at least electrically, and in some cases thermally. The insulator 135 may also thermally isolate the electrodes 105 from the electrodes 110. Examples of materials suitable for use as the insulators 135 include air, a noble gas and silica aerogel. In some cases the insulators 135 may be a vacuum. The electrodes 105, 110 are electrically isolated by insulators 137, 140, respectively, which may be composed of a same or a different material as the insulators 135.

Those skilled in the art appreciate that a TEC is a solid-state device that employs current to transport thermal energy. When the current I flows through the path formed by the electrodes 105, 110 and the pellets 115, 120, thermal energy (heat) is absorbed from the electrodes 105 and transported outward to, and dissipated by, the electrodes 110. It is believed that in the p-type pellets 115, holes transport thermal energy in the direction of the current I, while in the n-type pellets, thermal energy is transported counter to the direction of the current. Thus, the pellets 115, 120 can act in parallel to transport thermal energy from the center area of the TEC 100 to the perimeter. If heating of the center area is desired, the direction of the current I may be reversed to cause heat to be transported from the perimeter to the center area.

An insulator 145 electrically isolates the electrodes 105 from a thermal load 150 while providing sufficient thermal conductivity to allow the thermal load 150 to be cooled or heated during operation of the TEC 100. An insulator 155 electrically isolates the electrodes 110 from an optional heat sink 160 while allowing heat to flow to or from the heat sink. Non-limiting examples of materials suitable for use as the insulators 145, 155 include ceramics such as alumina, aluminum nitride and beryllium nitride, and polymers loaded with a thermally conducting filler material.

Figure 1B:
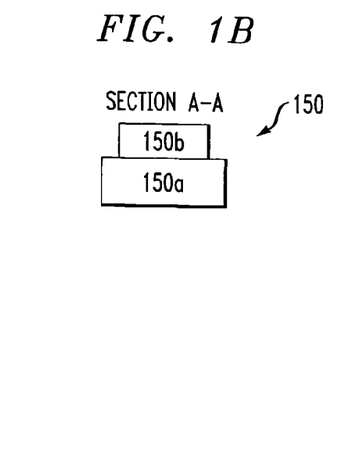

FIG. 1B illustrates one embodiment of the thermal load 150 taken at section A-A of FIG. 1A. The thermal load 150 may include a cooling stage 150a and a heat-generating device 150b in thermal contact with the cooling stage 150a. The cooling stage 150a may be constructed of any thermally conductive material, such as a metal or thermally conductive ceramic. The device 150b is in thermal contact with the cooling stage 150a. In the present context, the device 150b is in thermal contact with the cooling stage 150a when it is tightly thermally coupled to the cooling stage 150a. Tight thermal coupling may be, e.g., by virtue of direct, physical contact, or by contact with an intermediate thermal conductor such as heat-sink compound or a thermally conducting pad. In an alternate embodiment discussed further below, the insulator 145 may also be the wall of a tube passing through the center of the TEC 100, and the thermal load 150 may be a fluid in the tube.

If used, the heat sink 160 may be any passive or active apparatus that may transport heat from the perimeter of the TEC 100. In some cases, the heat sink may be a passive radiator. In other cases, as discussed further below, the heat sink may be another spreading TEC configured in a cascade with the TEC 100.

Figure 2:
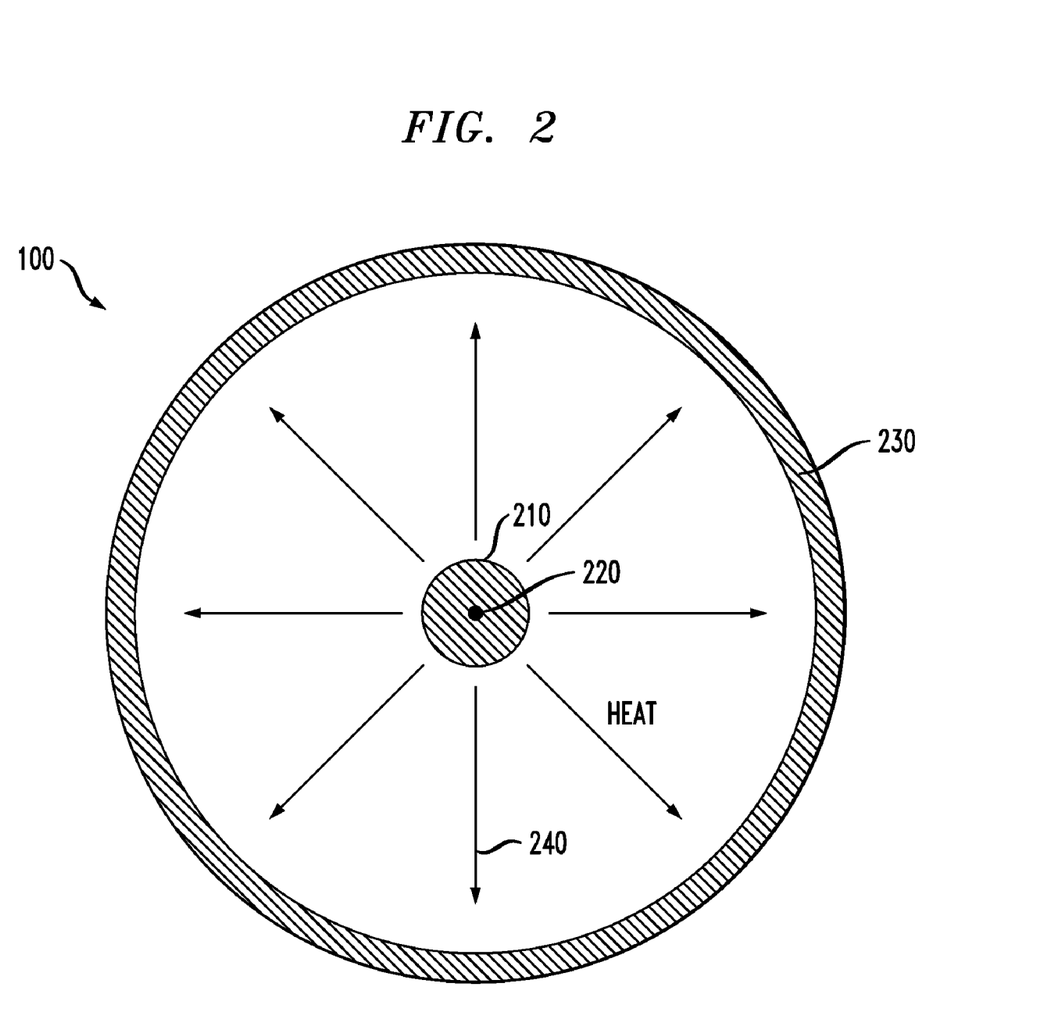
FIG. 2 illustrates heat flow in a spreading TEC.

FIG. 2 illustrates a simplified plan view of the TEC 100. A central region 210 is defined that has a center 220 and includes the first set 105 of metal electrodes, the insulators 137, 145, and the thermal load 150. An annular region 230 includes the second set 110 of metal electrodes and the insulators 140, 155. Vectors 240 represent the flow of heat from the central region 210 to the annular region 230 when the TEC 100 is operating in cooling mode.

Figure 3A:
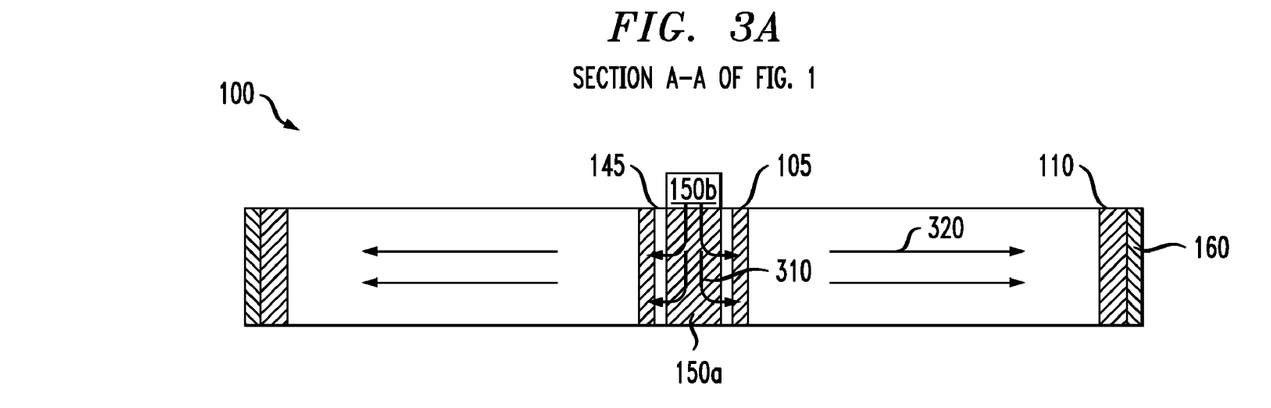
FIGS. 3A and 3B illustrate alternate embodiments of a cooling stage.

FIG. 3A illustrates a view of the TEC 100 taken at section A-A in FIG. 1A. Heat may flow from the device 150b to the electrodes 105 by passive thermal conduction as indicated by heat flow paths 310. The heat then flows from the electrodes 105 to the electrodes 110 as indicated by heat flow vectors 320. Of course, if heating of the device 150b were desired, the direction of heat flow would be reversed.

Figure 3B:
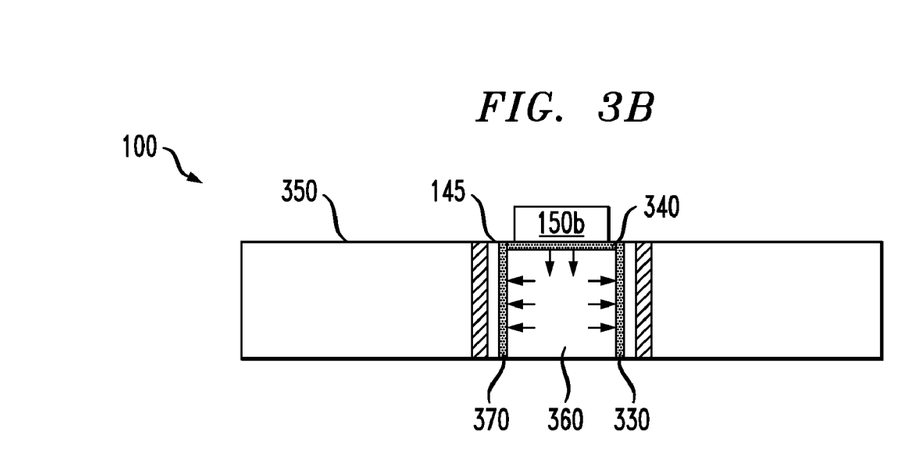

FIG. 3B illustrates an alternate embodiment in which the cooling stage is replaced by a heat pipe 330. In this case, the TEC 100 may be mounted to the heat pipe 330 so that the insulator 145 is thermally coupled to the outer surface of the heat pipe 330. An end 340 of the heat pipe 330 may optionally be configured to be flush with a face 350 of the TEC 100 as illustrated. The heat-generating device 150b may be mounted to the end 340 of the heat pipe 330, into which heat may flow axially from the device 150b and transfer to a vapor phase 360 via vaporization of a working fluid. Heat may then flow to the TEC 100 radially through the insulator 145 via condensation of the vapor phase 360. The working fluid may then return to the end 340 via a capillary lining 370. This embodiment may reduce inefficiency of heat extraction from the device 150b related to finite heat conduction of the cooling stage 150a.

Figure 4:
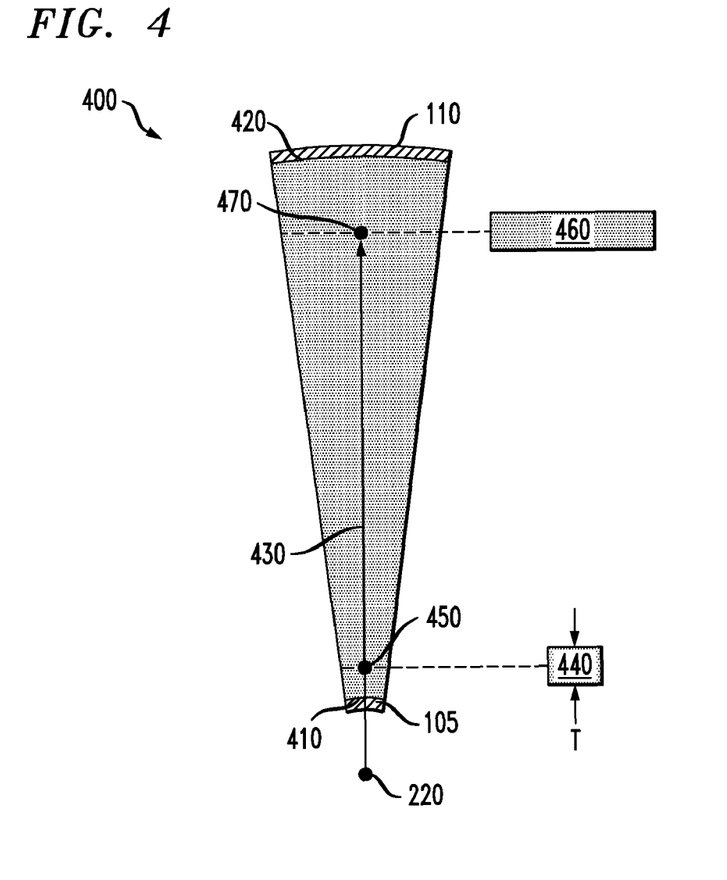
FIG. 4 illustrates a single thermoelectric pellet.

FIG. 4 illustrates a single pellet 400 in greater detail. The geometry of the pellet 400 is representative of one or more of the pellets 115, 120. A first surface 410 of the pellet 400 is in contact with one of the electrodes 105. A second surface 420 is in contact with one of the electrodes 110. Electrodes 105, 110 that are connected directly through a single pellet 400 are neighboring electrodes. A vector 430 indicates the direction of heat flow in the pellet 400 when the TEC 100 is operated in cooling mode. The pellet 400 has a cross-sectional area 440, with thickness T, associated with a first distance (radius) 450 from the center 220. The pellet 400 has a cross-sectional area 460, associated with a second distance 470 from the center

220. When the current I flows through the path formed by the electrodes 105, 110 and the pellets 115, 120, current flows over the cross sectional areas 440, 460.

In one aspect of the illustrated embodiment, the cross-sectional area of the pellet 400 increases along a path from the first surface 410 to the second surface 420. In another aspect, the increase in cross-sectional area is monotonic and approximately linear with increasing radius.

There are three approaches that may be used to improve thermoelectric coolers. First, $\Delta T$, the difference between the temperature of the cold and hot sides, may be increased. Second, the thermal flux, or watts per unit area, can be increased at a given $\Delta T$. Third, the thermodynamic efficiency can be increased. The increase of cross-sectional area of the pellets with increasing radius addresses the third approach.

This increase results in the electrodes 110 having a larger surface area than the electrodes 105. This aspect results in three effects. First, the electrical contact resistance associated with the interface between the electrode 110 and the second surface 420 is reduced by virtue of the larger surface area of the interface. This reduces parasitic ohmic heating at the interface that may reduce TEC 100 efficiency. Second, the heat flow through the pellet 400 is spread over a larger area, increasing of thermodynamic efficiency of the TEC 100 relative to a case in which no spreading occurs. Moreover, the efficiency of the heat sink 160 is proportional to its outer base surface area. Thus, the larger surface area at the perimeter of the TEC 100 also provides increased efficiency of heat dissipation by the heat sink 160. Third, the current density through the pellet 400 decreases with increasing radius. This reduces electrical resistance of the pellets 115, 120 as the distance from the central region 210 increases. The decreased electrical resistance is thought to reduce parasitic ohmic heating in the pellets that would otherwise reduce the efficiency of the TEC 100.

In another aspect, the cooling effect of the TEC 100 is concentrated in the central region 210. Thus, the cooling may be used to target a power dissipating source with a dimension smaller than the TEC 100. In some cases a dimension of a power dissipating source may be on the order of the diameter of the central region 210 or smaller.

The TEC 100 may be of any thickness compatible with the manufacturing method used. In some cases the thickness will be optimized to meet system design objectives of heat flow and thermodynamic efficiency. Optimization of the thickness may also be a function of the material chosen. One skilled in the art is able to determine the necessary thickness given particular constraints. The method of manufacture of the TEC 100 will depend on the dimensions chosen.

In some cases, the TEC 100 is a thin-film device, and may be formed on a semiconductor or ceramic substrate using appropriate conventional techniques. When formed as a thin-film device, the thickness of the TEC 100 may be about 100 μm or larger. In other cases, the TEC 100 may be formed by assembly of discretely formed components, and may have a thickness and radius on the order of one centimeter or larger. In such cases, the TEC 100 may be formed by assembly of the discreet components by, e.g., soldering of the components. While in principle there is no limit to the thickness of the TEC 100, there may be a upper value related to practical limits to the pellet height and the fact that the thermal conductivity of the thermal load 150 is non-ideal.

While the TEC 100 presents a two-dimensional embodiment, three-dimensional embodiments are also contemplated. In some cases, the thickness T of the pellet 400 may increase as the distance from the center 220 increases. In another embodiment, a hemispherical TEC can be constructed according to the principles described for the TEC 100. Such an embodiment may result in a particularly compact and efficient TEC design for a given rate of heat removal. In this case, the increase of cross-sectional area with increasing radius may be monotonic and approximately proportional to the square of the radius.

Another embodiment is a method of cooling the heat-generating device 150b. The method includes driving a current through the TEC 100 whose electrical conduction path has metal electrodes, 105, 110 and one or more doped semiconductor pellets 115, 120. Neighboring electrodes 105, 110 on the path are connected by one of the one or more doped semiconductor pellets 115, 120. The driving causes heat to be absorbed from the device 150b at a first non-null subset of the electrodes 105, 110 and to be dissipated at a second non-null subset of the electrodes 105, 110. Each electrode 105, 110 is in the first or second subset, and the first and second subsets are disjoint. The current flows over a cross-sectional area 440, 460 of semiconductor that varies monotonically in one or more of the pellets 115, 120.

Figure 5:
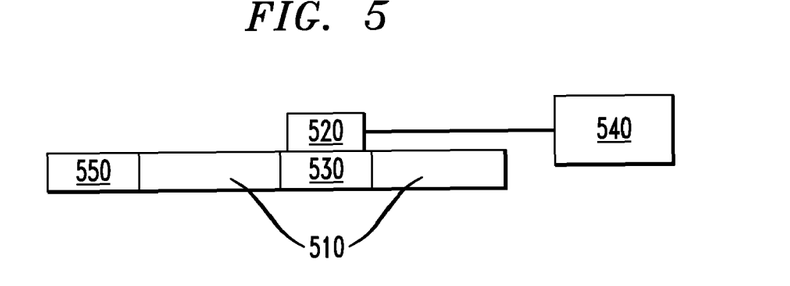
FIG. 5 illustrates an electronic system including a spreading TEC.

Turning now to FIG. 5, a system 500 is illustrated that includes a TEC 510 and an electronic device 520. The TEC 510 is constructed according to the principles described herein, and has a thermally conducting central region 530. The electronic device 520 is over and in thermal contact with the central region 530, and is configured to dissipate power provided by a power source 540. A heat sink 550 may optionally be thermally coupled to the TEC 510. The electronic device 520 may be any power-dissipating device, such as a quantum cascade laser (QCL), an integrated circuit or an infrared detector. In some cases the electronic device 520 is small enough to fit within the central region 530. In cases where the electronic device is larger than the central region, a region of locally maximum power output of the electronic device 520 may be placed in thermal contact with the central region 530.

Figure 6:
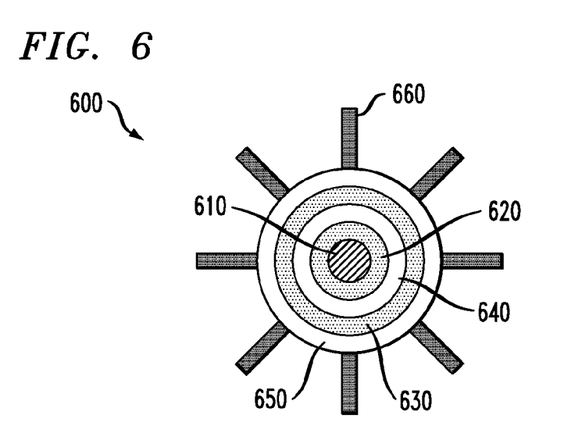
FIG. 6 illustrates cascaded spreading TEC.

Turning to FIG. 6, an embodiment of a cascaded TEC 600 is illustrated. A thermal load 610 is located at the center of a first spreading TEC 620. The TEC 620 is electrically insulated from a second TEC 630 by an insulator 640. An optional insulator 650 electrically insulates heat sink fins 660 from the second TEC 630. The insulators may be electrically insulating while allowing sufficient heat flow from the TEC 620 to the TEC 630 to provide a cumulative cooling effect to the thermal load 610.

The cascaded TEC 600 advantageously increases the surface area available to dissipate heat from the thermal load 610. The second TEC 630 may also increase the temperature difference across the first TEC 620, thus increasing the rate of heat flow across the TEC 620. While two TEC stages are shown, the number of stages may be more than two, with a practical limit determined by such factors as, e.g., size, non-ideal materials and decreasing benefit of additional stages.

Figure 7A:
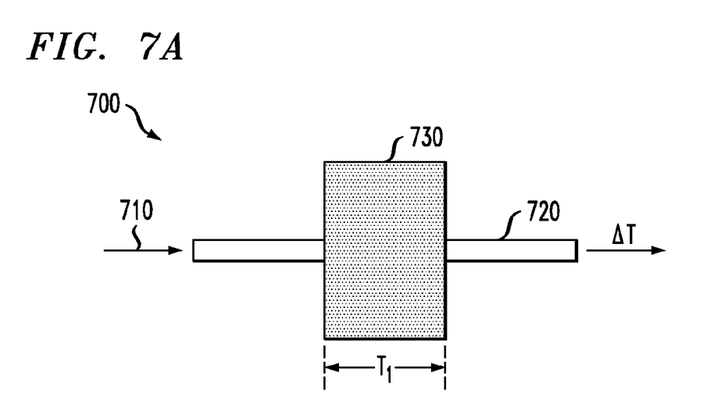
FIGS. 7A and 7B illustrate temperature control of a fluid using a spreading TEC.

In another embodiment 700 illustrated in FIG. 7, one or more TECs may be used to regulate the temperature of a fluid in a tube occupying the center region of the TECs. In FIG. 7A, a fluid 710 flows through a tube 720. The tube 720 passes through a single TEC 730 designed to produce a temperature change $\Delta T$ of the fluid 710. The TEC 730 has a thickness $T_1$ that may be chosen to result in the desired $\Delta T$ of the fluid 710. The change of temperature may also be a function of the diameter of the tube 720, and the rate of flow and nature of the fluid 710.

The fluid 710 may be a liquid or a gas. Moreover, $\Delta T$ may be positive or negative depending on the direction of current flow through the TEC 730. The TEC 730 may be used to warm or cool the fluid 710, or may be coupled to control circuitry (not shown) to regulate the temperature by active feedback.

Figure 7B:
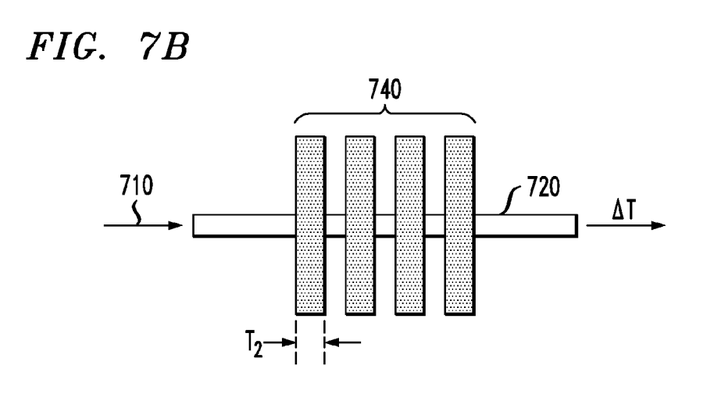

FIG. 7B illustrates an alternate embodiment in which multiple TECs 740 are used, each with a thickness $T_2$. Each TEC 740 may produce a temperature change $\delta T$ of the fluid 710, resulting in a net temperature change $\Delta T$. This embodiment may be advantageous by allowing the use of a standard TEC design in multiple stages to produce the desired temperature control or $\Delta T$. The TECs 740 may be collocated to produce a cumulative $\Delta T$ in the fluid, or may be distributed in a cooling system to provide cooling proximate a thermal load.

Although the present embodiments has been described in detail, those skilled in the art should understand that they could make various changes, substitutions and alterations herein without departing from the spirit and scope of the invention in its broadest form.

What is claimed is:

1. An apparatus, comprising: a thermoelectric cooler including a first set of one or more metal electrodes, a second set of one or more metal electrodes, a first set of one or more doped semiconductor members of a first dopant type and a second set of semiconducting members of a second dopant type, each member of the first and second sets of members physically joining a corresponding one of the electrodes of the first set to a corresponding one of the electrodes of the second set; and wherein the one or more members of the first set and the one or more members of the second set are radially configured in a two-dimensional arrangement about a cooling stage having a topmost surface and a side surface, said side surface being in thermal contact with said electrodes of the first set, with members of the first set alternating with members of the second set, each member having a cross-sectional area that increases along a path from the one metal electrode of the first set to the one metal electrode of the second set, and said topmost surface being configured to be coupled to a heat-generating device by tight thermal coupling.

2. The apparatus of claim 1, further comprising a heat sink in thermal contact with the electrodes of the second set.

3. The apparatus of claim 1, wherein each member has a thickness and a width that both increase along a path from the one metal electrode of the first set to the one metal electrode of the second set.

4. The apparatus of claim 1, wherein the cooling stage is a heat pipe that contains a working fluid configured to transport heat via a vaporization and condensation cycle of the working fluid.

5. The apparatus of claim 1; wherein said topmost surface is flush with at least one of said members.

6. The apparatus of claim 1; wherein tight thermal coupling includes direct physical contact between said topmost surface and said device, or contact between said topmost surface and said device via heat-sink compound or a thermally conductive pad.

7. A method of cooling a heat generating device, comprising:
driving a current through a thermoelectric cooler whose electrical conduction path has metal electrodes and one or more doped semiconductor members of a first dopant type and one or more doped semiconductor members of a second dopant type, neighboring electrodes on the path being connected by one of the one or more doped semiconductor members of the first or second dopant types; and placing the device in thermal contact with a topmost surface of a cooling stage having a side surface that is in thermal contact with a first non-null subset of the electrodes, wherein the driving causes heat to be absorbed from the cooling stage at the side surface by the first subset of the electrodes and to be dissipated at a second non-null subset of the electrodes, each electrode being in the first or second subset, the first and second subsets being disjoint; and wherein the one or more members of the first subset and the one or more members of the second subset are radially configured in a two-dimensional arrangement about the cooling stage, with members of the first subset alternating with members of the second subset, and each member having a cross-sectional area that increases along a path from one electrode of the first subset to one electrode of the second subset.

8. The method of claim 7, wherein each member has a thickness and a width that both increase along a path from the one metal electrode of the first subset to the one metal electrode of the second subset.

9. The method of claim 8, further comprising:
absorbing a part of the heat into a heat sink by transferring the heat across a surface area of the electrodes of the second subset, the surface area being larger than a surface area of the electrodes of the first subset that absorbs the heat from the cooling stage.

10. The method of claim 7, wherein the cooling stage is a heat pipe that contains a working fluid configured to transport heat via a vaporization and condensation cycle of the working fluid.

11. The method of claim 7; further comprising locating said topmost surface flush with at least one of said members.

12. A system, comprising: a cooling stage having a topmost surface and a side surface; an electronic device configured to dissipate power and coupled to said topmost surface by tight thermal coupling; and a thermoelectric cooler with a central region in thermal contact with said side surface of the cooling stage, the cooler comprising a first set of one or more metal electrodes, a second set of one or more metal electrodes, a first set of one or more doped semiconductor members of a first dopant type and a second set of semiconducting members of a second dopant type, each member of the first and second sets of members physically joining a corresponding one of the electrodes of the first set to a corresponding one of the electrodes of the second set; and wherein the one or more members of the first set and the one or more members of the second set are radially configured in a two-dimensional arrangement about the cooling stage, with members of the first set alternating with members of the second set, and each member has a cross-sectional area that increases along a path from the one metal electrode of the first set to the one metal electrode of the second set.

13. The system of claim 12, wherein the thermoelectric cooler further comprises a heat sink thermally coupled to the electrodes of the second set.

14. The system of claim 13, wherein the heat sink is a cascaded thermoelectric cooler.

15. The system of claim 12, wherein the first set includes a plurality of the metal electrodes and the second set includes a plurality of the metal electrodes, and the sets of electrodes and the members form an electrical conduction path along which the members alternate with the electrodes and the electrodes of the first set alternate with the members of the second set.

16. The system of claim 15, wherein the metal electrodes of the first set are located in the central region, the electrodes of the second set are located in an annular region surrounding the central region, and the members are located between the central region and the annular region.

17. The system of claim 12, wherein the members comprise bismuth telluride.

18. The system of claim 12, wherein said cooling stage is a heat pipe that is configured to transport heat via a vaporization and condensation cycle of a working fluid contained thereby.

19. The system of claim 12; wherein said topmost surface is flush with at least one of said members.

20. The system of claim 12; wherein tight thermal coupling includes direct physical contact between said topmost surface and said device, or contact between said topmost surface and said device via heat-sink compound or a thermally conductive pad.

21. An apparatus, comprising:
- a thermoelectric cooler including a first set of one or more metal electrodes, a second set of one or more metal electrodes, a first set of one or more doped semiconductor members of a first dopant type and a second set of semiconducting members of a second dopant type, each member of the first and second sets of members physically joining a corresponding one of the electrodes of the first set to a corresponding one of the electrodes of the second set; and
- wherein the one or more members of the first set and the one or more members of the second set are configured in a three-dimensional hemispherical arrangement about a common central region, with members of the first set alternating with members of the second set, and each member has a cross-sectional area that increases along a path from the one metal electrode of the first set to the one metal electrode of the second set, and
- wherein the cross-sectional area of the one or more members increases with increasing radius from the common central region approximately proportionally to the square of the radius.

* * * * *